US012327782B2

(12) United States Patent
Lin et al.

(10) Patent No.: US 12,327,782 B2
(45) Date of Patent: Jun. 10, 2025

(54) SYSTEMS FOR SEMICONDUCTOR PACKAGE MOUNTING WITH IMPROVED CO-PLANARITY

(71) Applicant: Taiwan Semiconductor Manufacturing Company Limited, Hsinchu (TW)

(72) Inventors: Wen-Yi Lin, New Taipei (TW); Kuang-Chun Lee, New Taipei (TW); Chien-Chen Li, Hsinchu (TW); Chen-Shien Chen, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 456 days.

(21) Appl. No.: 17/721,499

(22) Filed: Apr. 15, 2022

(65) Prior Publication Data
US 2022/0415773 A1    Dec. 29, 2022

Related U.S. Application Data

(60) Provisional application No. 63/213,877, filed on Jun. 23, 2021.

(51) Int. Cl.
| | | |
|---|---|---|
| *H01L 23/49* | (2006.01) | |
| *H01L 21/48* | (2006.01) | |
| *H01L 23/498* | (2006.01) | |
| *H01L 23/00* | (2006.01) | |
| *H01L 25/065* | (2023.01) | |

(52) U.S. Cl.
CPC .... *H01L 23/49816* (2013.01); *H01L 21/4853* (2013.01); *H01L 23/49833* (2013.01); *H01L 23/49838* (2013.01); *H01L 24/16* (2013.01); *H01L 24/32* (2013.01); *H01L 24/73* (2013.01); *H01L 25/0655* (2013.01); *H01L 2224/16227* (2013.01); *H01L 2224/16238* (2013.01); *H01L 2224/32225* (2013.01); *H01L 2224/73204* (2013.01); *H01L 2924/3511* (2013.01); *H01L 2924/3512* (2013.01); *H01L 2924/3841* (2013.01)

(58) Field of Classification Search
CPC .............. H01L 24/16; H01L 24/32; H01L 2224/16227; H01L 24/16238
USPC .......................................................... 257/690
See application file for complete search history.

(56) References Cited

U.S. PATENT DOCUMENTS

2013/0180772 A1\*  7/2013  Inoue ................. H05K 3/4007
                                                            228/256

FOREIGN PATENT DOCUMENTS

| CN | 109585390 A | \* | 4/2019 | ............ H01L 23/28 |
| CN | 110767636 A | \* | 2/2020 | ............ H01L 24/16 |

\* cited by examiner

*Primary Examiner* — Phuc T Dang
(74) *Attorney, Agent, or Firm* — The Marbury Law Group, PLLC

(57) ABSTRACT

A substrate for a semiconductor package includes an array of bonding pads on a first surface of the substrate, and a plurality of raised structures adjacent to at least some of the bonding pads on the first surface of the substrate. The raised structures may be configured to control the height of solder balls contacting the array of bonding pads when the package substrate is mounted onto a support substrate. The raised structures may compensate for a deformation of the package substrate so that the co-planarity of the solder balls may be improved, thereby providing an improved solder connection between the package substrate and the support substrate.

20 Claims, 11 Drawing Sheets

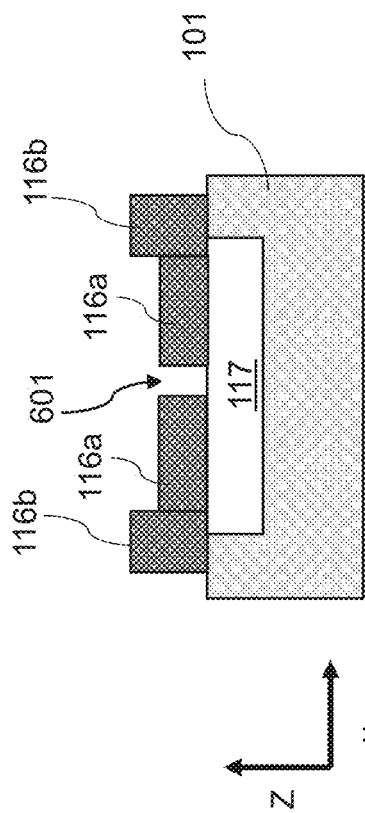
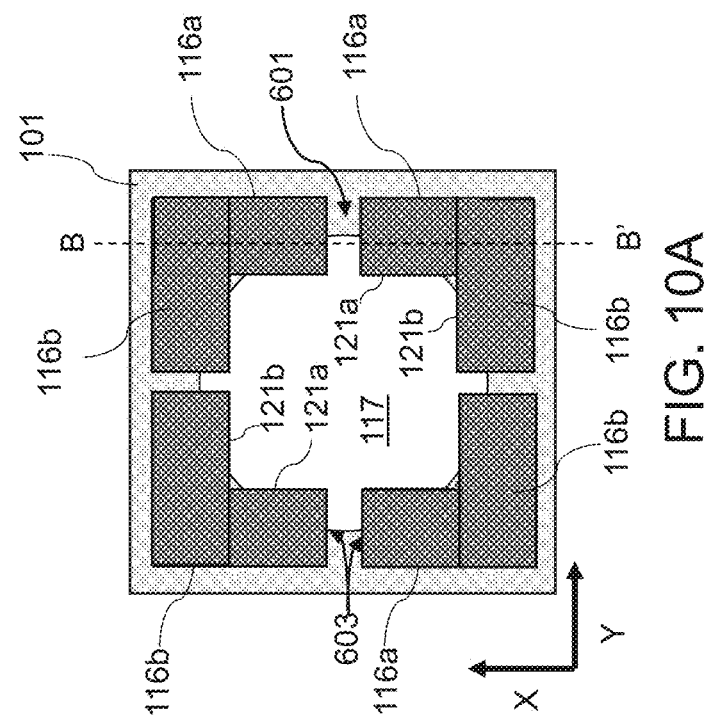
FIG. 10B
FIG. 10A

SYSTEMS FOR SEMICONDUCTOR PACKAGE MOUNTING WITH IMPROVED CO-PLANARITY

RELATED APPLICATIONS

This application claims priority to U.S. Provisional Patent Application No. 63/213,877 entitled "Novel PKG Coplanarity (COP) Window Enlarged Solution" filed on Jun. 23, 2021, the entire contents of which are hereby incorporated by reference for all purposes.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As semiconductor packages have become more complex, package sizes have tended to become larger to accommodate greater numbers of integrated circuits and/or dies per package. These larger and more complex semiconductor packages have created challenges in making effective and reliable interconnections to the semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10A is a bottom view of a portion of a package substrate including a plurality of raised structures adjacent to a conductive bonding pad according to yet another embodiment of the present disclosure.

FIG. 10B is a vertical cross-section view of the portion of the package substrate along line B-B' in FIG. 10A.

DETAILED DESCRIPTION

Figure 1A:
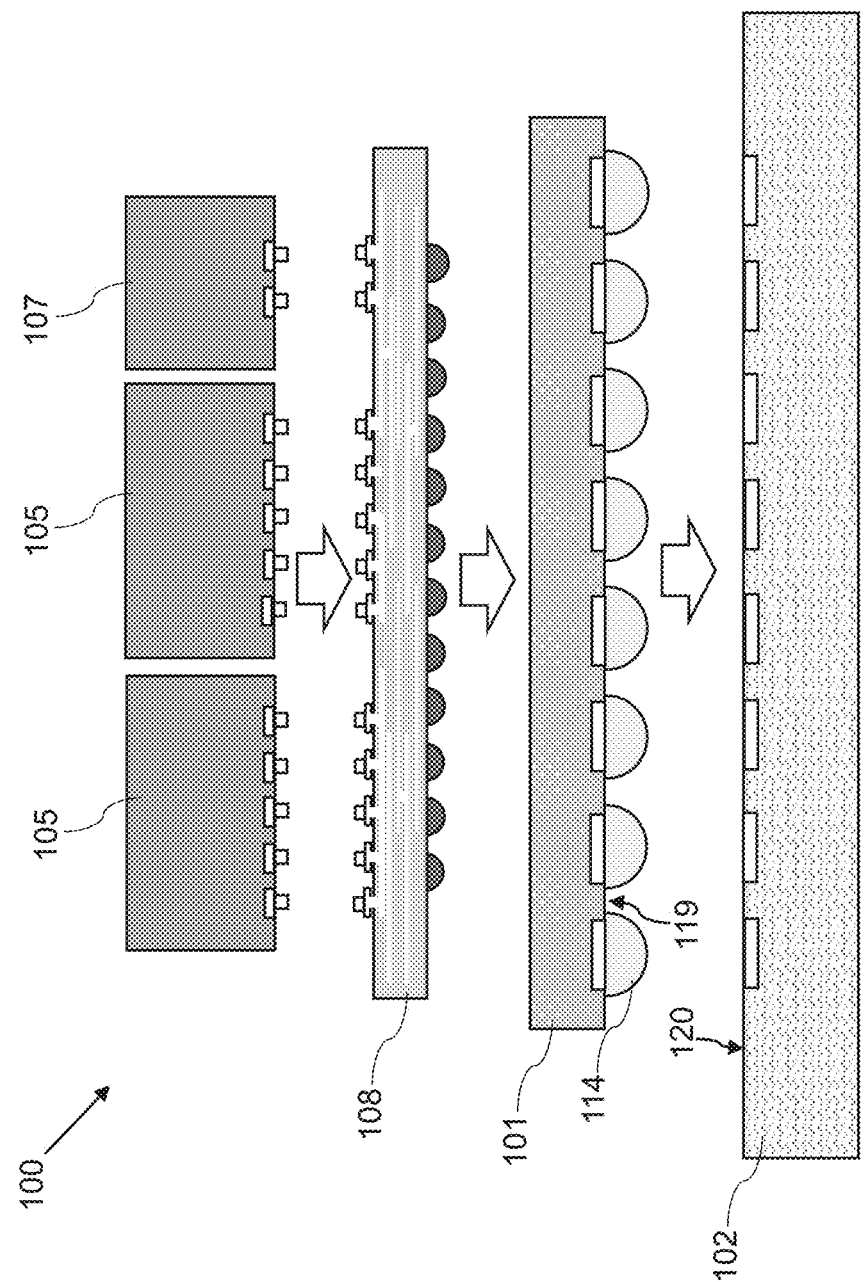
FIG. 1A is vertical cross-section exploded view of components of a semiconductor package during a package assembly and surface mounting process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package a number of semiconductor integrated circuit (IC) dies (i.e., "chips") may be mounted onto a common substrate, which may also be referred to as a "package substrate. In some embodiments, electrical connections to the semiconductor package may be made by mounting the package substrate onto a support substrate containing electrical interconnects, such as a printed circuit board (PCB).

Figure 1B:
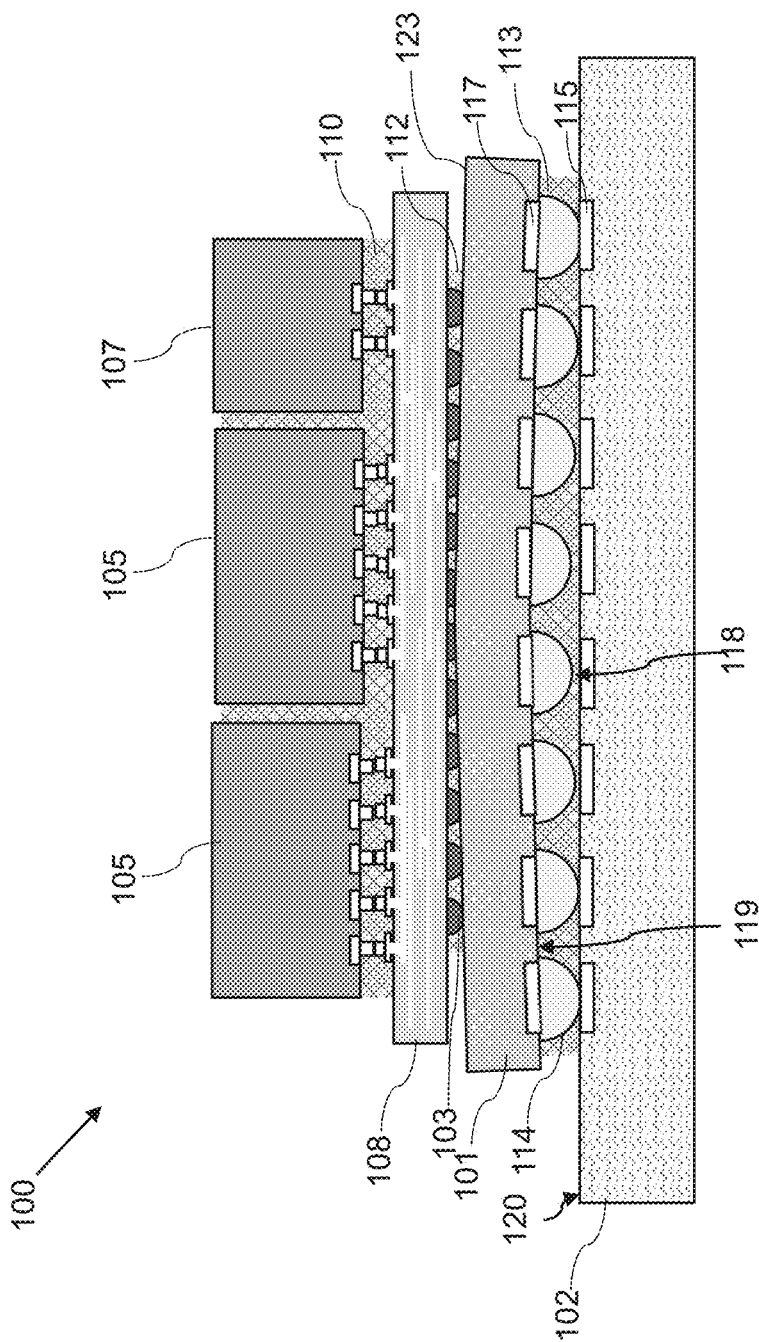
FIG. 1B is a vertical cross-section view illustrating an assembled semiconductor package mounted onto the surface of a support substrate.

FIG. 1A is vertical cross-section exploded view of components of a semiconductor package 100 during a package assembly and surface mounting process. FIG. 1B is a vertical cross-section view illustrating the assembled semiconductor package 100 mounted onto the surface of a support substrate 102, such as a printed circuit board (PCB). The semiconductor package 100 in this example is a chip-on-wafer-on-substrate (CoWoS) semiconductor package, although it will be understood that a similar assembly and mounting process may be utilized for other types of semiconductor packages, such as integrated fan-out (InFO) semiconductor packages, flip-chip semiconductor packages, and the like.

Referring to FIGS. 1A and 1B, the package 100 includes integrated circuit (IC) semiconductor devices, such as first IC semiconductor devices 105 and second IC semiconductor devices 107. During the package assembly process, the IC semiconductor devices 105 and 107 are mounted on an interposer 108, and the interposer 108 containing the IC semiconductor devices 105 and 107 is mounted onto a package substrate 101 to form a package 100. The package 100 is then mounted to a support substrate 102, such as a printed circuit board (PCB), by mounting the package substrate 101 to the support substrate 102 using an array of solder balls 114 on the lower surface 119 of the package substrate 101.

A parameter to ensure proper interconnection between the package 100 and the support substrate 102 is the degree of co-planarity between the surfaces of the solder balls 114 that are brought into contact with the mounting surface (i.e., the upper surface 120 of the support substrate 102 in FIG. 1A). A low amount of co-planarity between the solder balls 114 may result in instances of solder cold joints (i.e., insufficient melting of the solder material, resulting in a poor bond that is susceptible to cracking and separation) and/or solder bridging issues (i.e., solder material from one solder ball 114 contacting material from a neighboring solder ball 114, resulting in an unintended connection) during the reflow process.

Deformation of the package substrate 101, such as stress-induced warping of the package substrate 101, may be a significant contributor to low co-planarity of the solder balls 114 during surface mounting of the package 100 onto a support substrate 102. This is schematically illustrated in FIG. 1B, which illustrates a package substrate 101 that includes a warpage deformation. Deformation of the package substrate 101 may significantly increase the risk of defective solder connections with the underlying support substrate 102. As shown in FIG. 1B, for example, a deformation of the package substrate 101 may cause at least some of the solder joints between the package substrate 101 and the support substrate 102 to fail completely, as indicated by the arrow 118 in FIG. 1B.

Deformation of the package substrate 101 is not an uncommon occurrence, particularly in the case of semiconductor packages used in high-performance computing applications. These high-performance semiconductor packages tend to be relatively large and include a greater quantity of IC semiconductor devices mounted to the package substrate, which creates a higher likelihood that the package substrate will be subject to warping or other deformations. This has made effective solder mounting of these types of semiconductor packages onto a support substrate much more challenging.

According to various embodiments of the present disclosure, a substrate for a semiconductor package may include an array of bonding pads on a first surface of the substrate, and a plurality of raised structures adjacent to at least some of the bonding pads on the first surface of the substrate. In embodiments, the raised structures may be configured to control the height, size and/or shape of solder balls contacting the array of bonding pads when the package substrate is mounted onto a support substrate. In various embodiments, the raised structures may compensate for a deformation of the package substrate so that the co-planarity of the solder balls may be improved, thereby providing an improved solder connection between the package substrate and the support substrate.

Figure 2:
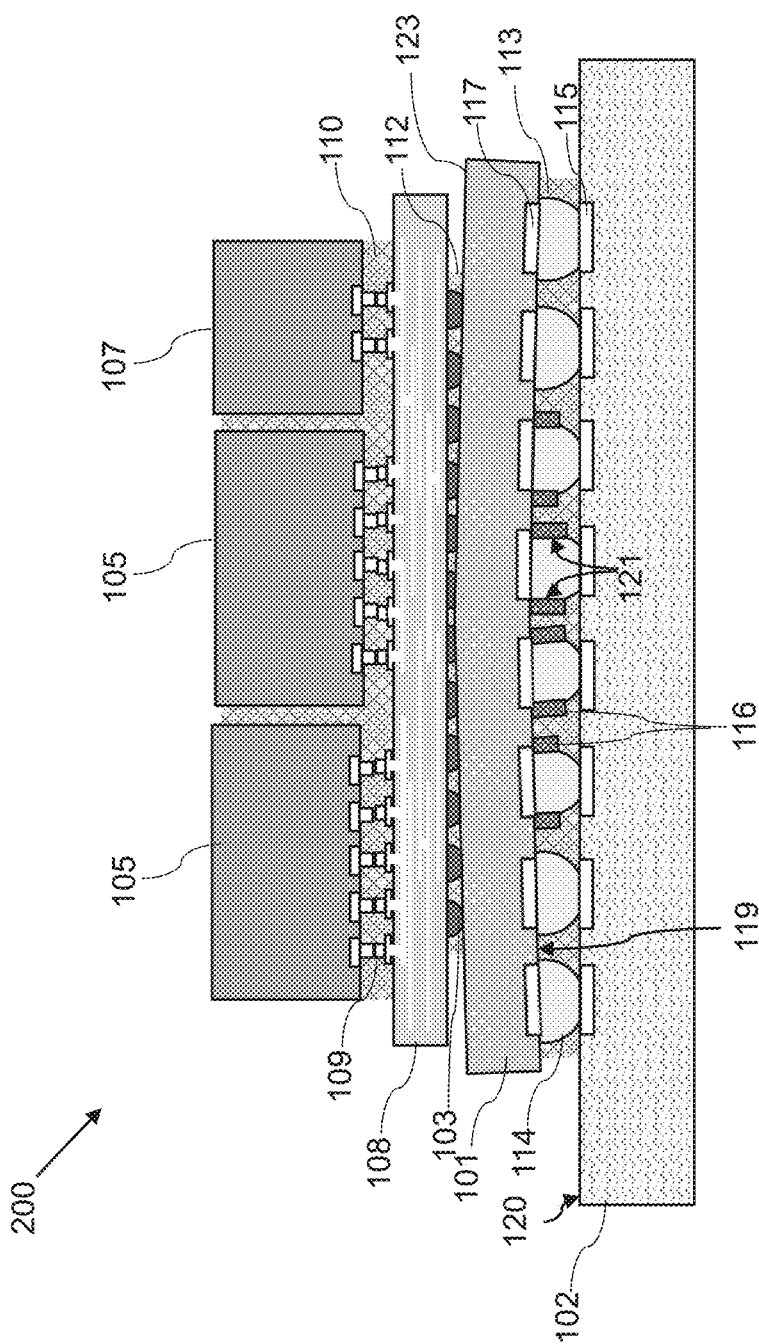
FIG. 2 is a vertical cross-section view illustrating a semiconductor package including a plurality of raised structures on a lower surface of the package substrate mounted to a support substrate according to an embodiment of the present disclosure.

FIG. 2 is a vertical cross-section view of a semiconductor package 200 mounted to a support substrate 102 by an array of solder balls 114 according to various embodiments of the present disclosure. The semiconductor package 200 shown in FIG. 2 may include similar components and structure as the semiconductor package 100 shown in FIGS. 1A and 1B. The semiconductor package 200 shown in FIG. 2 differs from the semiconductor package 100 of FIGS. 1A and 1B in that a plurality of raised structures 116 may be located on the lower surface 119 of the package substrate 101. The raised structures 116 may form a plurality of sidewalls 121 that are located adjacent to at least some of the bonding pads 117 on the lower surface 119 of the package substrate 101. In various embodiments, the sidewalls 121 may help to control the height, size, and/or shape of the solder balls 114 contacting the bonding pads 117.

Referring to FIG. 2, the package 200 includes integrated circuit (IC) semiconductor devices, such as first IC semiconductor devices 105 and second IC semiconductor devices 107. In various embodiments, the first IC semiconductor devices 105 may be three-dimensional devices, such as three-dimensional integrated circuits (3DICs), System on Chip (SOC) or System on Integrated Circuit (SoIC) devices. A three-dimensional IC semiconductor device 105 may be formed by placing chips over chips on a semiconductor wafer level. These three-dimensional devices may provide improved integration density and other advantages, such as faster speeds and higher bandwidths, due to a decreased length of interconnects between the stacked chips. In some embodiments, a first three-dimensional IC semiconductor device 105 may also be referred to as a "first die stack."

The semiconductor package 200 may further include second IC semiconductor devices 107. The second IC semiconductor device(s) 107 may be different from the first IC semiconductor device(s) 105 in terms of their structure, design and/or functionality. The one or more second IC semiconductor devices 107 may be three-dimensional IC semiconductor devices, which may also be referred to as "second die stacks." In some embodiments, the one or more second IC semiconductor devices 107 may include a memory device, such as a high bandwidth memory (HBM) device. In the example shown in FIG. 2, the semiconductor package 200 includes two SOC die stacks 105 and one HBM die stack 107, although it will be understood that the semiconductor package 100 may include a greater or lesser number of IC semiconductor devices.

Referring again to FIG. 2, the IC semiconductor devices 105, 107 may be mounted on an interposer 108. In some embodiments, the interposer may be an organic interposer composed of a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer are contemplated within the scope of the disclosure. The interposer 108 may include a plurality of conductive bonding pads on upper and lower surfaces of the interposer and a plurality of conductive interconnects extending through the interposer 108 between the upper and lower bonding pads of the interposer 108. The conductive interconnects may distribute and route electrical signals between IC semiconductor devices 105, 107 and an underlying package substrate 101. Thus, the interposer may also be referred to as a redistribution layer (RDL). A plurality of metal bumps 109, such as microbumps, may electrically connect conductive bonding pads on the bottom surfaces of the first and second die stacks 105, 107 to the conductive bonding pads on the upper surface of the interposer 108. In one non-limiting embodiment, metal bumps 109 in the form of microbumps may include a plurality of first metal stacks, such as a plurality of Cu—Ni—Cu stacks, located on the bottom surfaces of the first die stacks 105 and the second die stacks 107, and a plurality of second metal stacks (e.g., Cu—Ni—Cu stacks) located on the upper surface of the interposer 108. A solder material, such as tin (Sn), may be located between respective first and second metal stacks to electrically connect the first die stacks 105 and the second die stacks 107 to the interposer 108. Other suitable materials for the metal bumps 109 are within the contemplated scope of disclosure.

After the IC semiconductor devices 105, 107 are mounted to the interposer 108, a first underfill material portion 110 may optionally be provided in the spaces surrounding the metal bumps 109 and between the bottom surfaces of the IC semiconductor devices 105, 107 and the upper surface of the interposer 108 as shown in FIG. 2. The first underfill material portion 110 may also be provided in the spaces laterally separating adjacent IC semiconductor devices 105, 107 of the semiconductor package 100. In various embodiments, the first underfill material portion 110 may be composed of an epoxy-based material, which may include a composite of resin and filler materials.

Referring again to FIG. 2, the interposer 108 may be may be mounted on a package substrate 101 that may provide mechanical support for the interposer 108 and the IC semiconductor devices 105, 107 that are mounted thereon. The package substrate 101 may be composed of a suitable material, such as an organic material (e.g., a polymer and/or thermoplastic material), a semiconductor material (e.g., a semiconductor wafer, such as a silicon wafer), a ceramic material, a glass material, combinations thereof, or the like. Other suitable substrate materials are within the contemplated scope of present disclosure. In various embodiments, the package substrate 101 may include a plurality of conductive bonding pads in an upper surface of the package substrate 101. A plurality of metal bumps 103, such as C4 solder bumps, may electrically connect conductive bonding pads on the bottom surface of the interposer 108 to the conductive bonding pads on the upper surface 123 of the package substrate 101. In various embodiments, the metal bumps 103 may include a suitable solder material, such as tin (Sn).

A second underfill material portion 112 may be provided in the spaces surrounding the metal bumps 103 and between the bottom surface of the interposer 108 and the upper surface 123 of the package substrate 101, as illustrated in FIG. 2. In various embodiments, the second underfill material portion 112 may be composed of an epoxy-based material, which may include a composite of resin and filler materials. In some embodiments, a lid or cover (not shown in FIG. 2) may be mounted to the package substrate 101 and provide an enclosure around the upper and side surfaces of the IC semiconductor devices 105, 107.

Referring again to FIG. 2, the package 100, which may include the interposer 108 and IC semiconductor devices 105, 107 on a package substrate 101, may be mounted to a support substrate 102, such as a printed circuit board (PCB). Other suitable support substrates 102 are within the contemplated scope of disclosure. The package substrate 101 of the package 100 may include a plurality of conductive bonding pads 117 in a lower surface 119 of the package substrate 101. A plurality of conductive interconnects may extend through the package substrate 101 between conductive bonding pads on the upper and lower surfaces of the package substrate 101. A plurality of solder balls (or bump structures) 114 may electrically connect the conductive bonding pads 117 on the lower surface 119 of the package substrate 101 to a plurality of conductive bonding pads 115 on the upper surface 120 of the support substrate 102. The bonding pads 117 and 115 may be formed of a suitable conductive material, such as copper. Other suitable conductive materials are within the contemplated scope of disclosure. The plurality of solder balls 114 on the lower surface 119 of the package substrate 101 may form an array of solder balls 114, such as a ball grid array (BGA) that may include an array pattern that corresponds to an array pattern of the conductive bonding pads 115 on the upper surface 120 of the support substrate 102. In one non-limiting example, the array of solder balls 114 may include a grid pattern and may have a pitch (i.e., distance between the center of each solder ball 114 and the center of each adjacent solder ball) that is between about 0.8 and 1.0 mm, although larger and smaller pitches may be used.

The solder balls 114 may be composed of any suitable solder material, such as tin, lead, silver, indium, zinc, nickel, bismuth, antimony, cobalt, copper, germanium, alloys thereof, combinations thereof, or the like. Other suitable materials for the solder balls 114 are within the contemplated scope of disclosure.

In some embodiments, the lower surface 119 of the package substrate 101 may be composed of a coating of solder resist (SR) material, which may also be referred to as a "solder mask". A solder resist (SR) material coating may provide a protective coating for the package substrate 101 and any underlying circuit patterns formed on or within the package substrate 101. An SR material coating may also inhibit solder material from adhering to the lower surface 119 of the package substrate 101 during a reflow process. In embodiments in which the lower surface 119 of the package substrate 101 is composed of an SR coating, the SR material coating may include a plurality of openings through which the bonding pads 117 are exposed.

As discussed above, the lower surface 119 of the package substrate 101 may include a plurality of raised structures 116. The raised structures 116 may form a plurality of sidewalls 121 that are located adjacent to at least some of the bonding pads 117 on the lower surface 119 of the package substrate 101.

The sizes, shapes and locations of the raised structures 116 may vary across different regions of the package substrate 101. In some embodiments, the size, shape and locations of the raised structures 116 may be selected to compensate for a deformation of the package substrate 101, such as a stress-induced warping of the package substrate 101. In the exemplary embodiment shown in FIG. 2, for example, the deformation of the package substrate 101 may have a bow- or cup-shape such that a separation between the lower surface 119 of the package substrate 101 and the upper surface 120 of the support substrate 102 may be smallest at the periphery of the package substrate 101 and may increase towards the center of the package substrate 101. Accordingly, in the exemplary package 200 of FIG. 2, some of the solder balls 114 may have no raised structures 116 near the periphery of the package substrate 101, and a height of the raised structures 116 increases towards the center of the package substrate 101. The sizes, shapes and locations of the raised structures 116 may be selected to compensate for any type of deformation to which the package substrate 101 may be subjected to. In some embodiments, all the solder balls 114 may be adjacent to raised structures 116, and a height of the raised structures 116 may increase or decrease towards the center of the package substrate 101.

Figure 3:
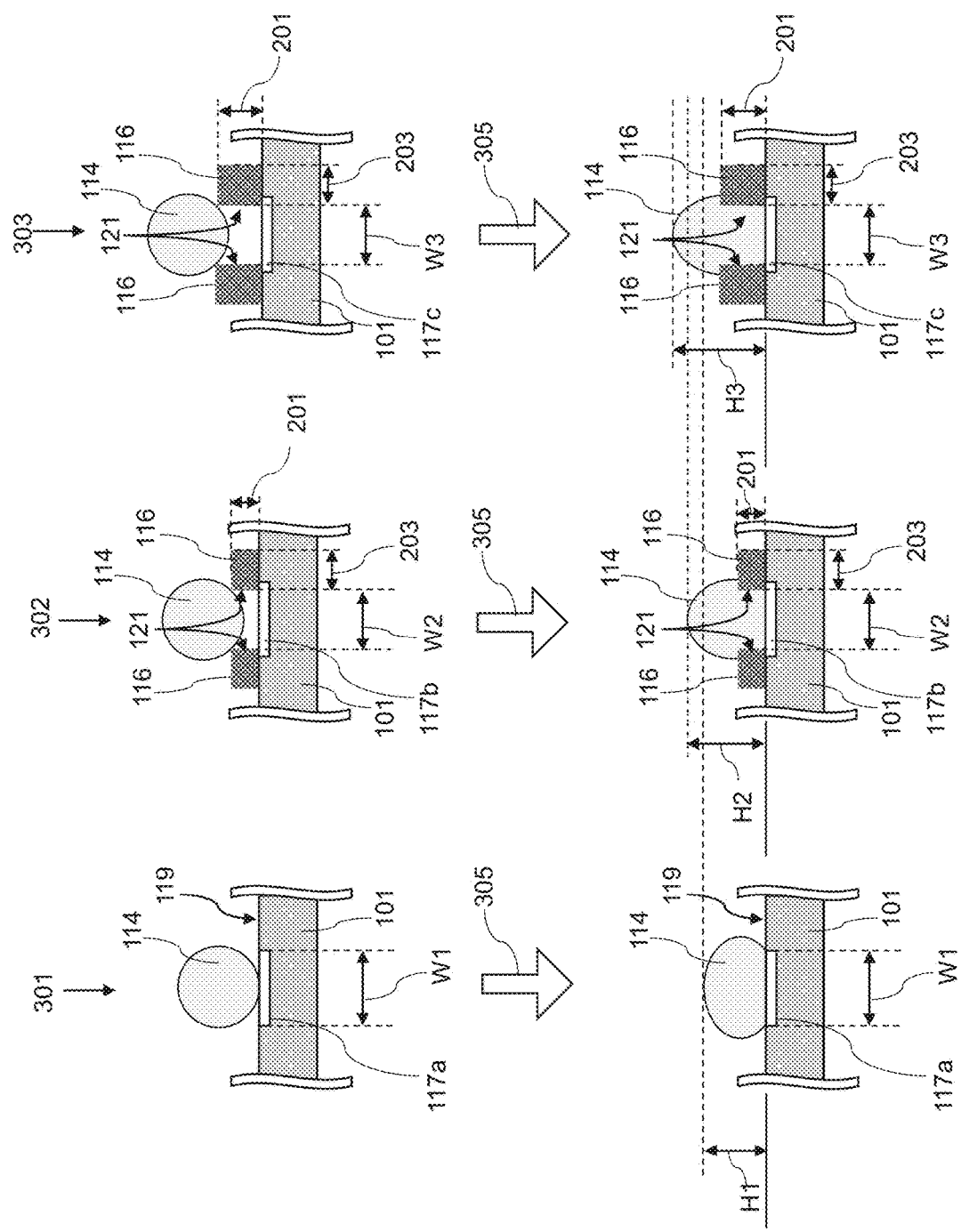
FIG. 3 is a vertical cross-section view showing solder balls provided on bonding pads in different regions of a package substrate according to an embodiment of the present disclosure.

The sizes, shapes and/or locations of the raised structures 116 may be configured to improve the co-planarity of the array of solder balls 114 contacting the bonding pads 117 on the lower surface 119 of the package substrate 101. FIG. 3 is a vertical cross-section view showing three conductive bonding pads 117a, 117b, and 117c in different regions 301, 302, 303 of a package substrate 101. FIG. 3 illustrates the package substrate 101 in an inverted configuration relative to FIG. 2 such that the lower surface 119 of the package substrate 101 including conductive bonding pads 117a, 117b and 117c is facing upwards. The top portion of FIG. 3 illustrates a plurality of solder balls 114 located over each of the conductive bonding pads 117a, 117b and 117c prior to a first solder reflow process, and the bottom portion of FIG. 3 illustrates the plurality of solder balls 114 contacting the respective conductive bonding pads 117a, 117b and 117c following the first solder reflow process.

Referring to FIG. 3, a first region 301 of the package substrate 101 shown on the left-hand side of FIG. 3 may not include any raised structures adjacent to the conductive bonding pad(s) 117a. A second region 302 of the package substrate 101 shown in the center of FIG. 3 may include raised structures 116 adjacent to the conductive bonding pad(s) 117b. In various embodiments, the raised structures 116 in the second region 302 may have a first height, size and/or shape. In some embodiments, each of the raised structures 116 in the second region 302 may have the same or substantially the same size and shape. Alternatively, the raised structures 116 in the second region 302 may have different sizes and/or shapes. In various embodiments, the raised structures 116 in the second region may include sidewalls 121 adjacent to the conductive bonding pad(s) 117b that may have a first height dimension 201.

A third region 303 of the package substrate 101 shown on the right-hand side of FIG. 3 may include raised structures adjacent to the conductive bonding pad(s) 117c. In various embodiments, the raised structures 116 in the third region 303 may have a second height, size and/or shape that may be different than the first height, size and/or shape of the raised structures 116 in the second region 302 of the package substrate 101. In some embodiments, each of the raised structures 116 in the third region 303 may have the same or substantially the same size and shape. Alternatively, the raised structures 116 in the third region 303 may have different sizes and/or shapes. In various embodiments, the raised structures 116 in the third region may include sidewalls 121 adjacent to the conductive bonding pad(s) 117c that may have a second height dimension 201 that is greater than the height dimension 201 of the sidewalls 121 in the second region 302 of the package substrate 101.

In various embodiments, the raised structures 116 in the second region 302 and the third region 303 of the package substrate 101 may have a width dimension 203 that is at least about 100 µm, such as between about 100 µm and about 800 µm, although raised structures 116 having smaller or greater width dimensions 203 may also be used. A raised structure 116 having a width dimension 203 of at least about 100 µm may help to maintain a suitable shape of the solder ball 114 during the bonding process.

In various embodiments, each of the conductive bonding pads 117a, 117b and 117c in the different regions 301, 302, 303 of the package substrate 101 may have the same size and shape. In the embodiment shown in FIG. 3, the surfaces of the bonding pads 117a, 117b, 117c are substantially co-planar with the lower surface 119 of the package substrate 101, which in some embodiments may be composed of a solder resist (SR) coating. Alternatively, the surfaces of the bonding pads 117a, 117b, 117c may be recessed relative to the lower surface 119 of the package substrate 101. In some embodiments, the surfaces of the bonding pads 117a, 117b, 117c may be raised relative to the lower surface 119 of the package substrate 101. In the region(s) 301 of the package substrate 101 that do not include raised structures 116, the surface of the bonding pad(s) 117a may be exposed over a first width dimension, W1.

In some embodiments, the raised structures 116 located in the second region 302 and/or the third region 303 of the package substrate 101 may be located partially over the surfaces of the conductive bonding pads 117b, 117c. As shown in FIG. 3, for example, the raised structures 116 in the second region 302 and in the third region 303 of the package substrate 101 are located partially over the surfaces of the conductive bonding pads 117b and 117c, such that the sidewalls 121 of the raised structures 116 extend in a vertical direction from the surfaces of the respective conductive bonding pads 117b and 117c. Raised structures 116 may partially cover the conductive bonding pads 117b and 117c on opposite sides of the bonding pads 117b and 117c. In the second region 302 of the package substrate 101, the distance between the sidewalls 121 on opposite sides of the bonding pad 117b may define a width, W2, of the exposed portion of the bonding pad 117b. Similarly, in the third region 302 of the package substrate 101, the distance between the sidewalls 121 on opposite sides of the bonding pad 117c may define a width, W3, of the exposed portion of conductive bonding pad 117c. In various embodiments, the width W3 of the exposed portion of bonding pad 117c in the third region 303 may be the same as the width W2 of the exposed portion of bonding pad 117b in the second region 302. Alternatively, the width W3 of the exposed portion of bonding pad 117c may be greater than the width W2 of the exposed portion of bonding pad 117b, or the width W3 of the exposed portion of bonding pad 117c may be less than the width W2 of the exposed portion of bonding pad 117b. Differences in the widths W2 and W3 of the exposed portions of the bonding pads 117b, 117c may produce variations in the shapes imparted to the solder balls 114 during the reflow process.

In various embodiments, the width(s) W2 and W3 of the exposed portions of the bonding pads 117b and 117c in the second region 302 and the third region 303 of the package substrate 101 may be less than the width, W1, of the exposed portion of the bonding pad(s) 117a in the first region 301 of the package substrate 101 that does not include raised structures 116. In various embodiments, the width(s) W2 and W3 of the exposed portions of the bonding pads 117b and 117c in the second region 302 and in the third region 303 may be at least about 70%, such as between about 70% and 90% of the width, W1, of the exposed portion of the bonding pad(s) 117a in the first region 301. This may help to ensure that the solder ball 114 may maintain a suitable shape for bonding with the corresponding bonding pad 115 of the support substrate 102.

Referring again to FIG. 3, solder balls 114 may be provided over the respective conductive bonding pads 117a, 117b and 117c in the different regions 301, 302 and 303 of the package substrate 101. As shown in the top portion of FIG. 3, the solder ball 114 may contact the conductive bonding pad 117a in the first region 301 of the package substrate 101 that does not include raised structures. The solder balls 114 may contact the raised structures 116 adjacent to the conductive bonding pads 117b and 117c in the second region 302 and in the third region 303 of the package substrate 101 such that the solder balls 114 do not contact the surfaces of the conductive bonding pads 117b and 117c. In various embodiments, each of the solder balls 114 may include a substantially equal volume of a suitable solder material as described above, and may have the same or a substantially similar shape. In some embodiments, each of the solder balls 114 may have an outer diameter that is greater than the width dimension, W1, of the conductive bonding pad(s) 117a in the first region 301 of the package substrate 101. In one non-limiting example, the conductive bonding pad(s) 117a in the first region 301 may have a width dimension, W1, that is between about 500 μm and about 550 μm (e.g., ~530 μm), and the solder balls 114 may have an outer diameter that is between about 600 μm and about 650 μm (e.g., ~630 μm), although greater and lesser dimensions for the solder balls 114 and/or the bonding pads 117a are within the contemplated scope of disclosure.

Referring again to FIG. 3, a first solder reflow process may be performed, schematically indicated by arrows 305 in FIG. 3. The first solder reflow process may include subjecting the package substrate 101 to an elevated temperature (e.g., at least about 250° C.) in order to melt the solder balls 114 and cause the solder balls 114 to adhere to the conductive bonding pads 117a, 117b and 117c. Following the first reflow process, the package substrate 101 may be cooled causing the solder balls 114 to re-solidify. The lower portion of FIG. 3 illustrates the various regions 301, 302 and 303 of the package substrate 101 following the first reflow process.

Referring again to FIG. 3, following the first solder reflow process, the solder ball 114 in the first region 301 of the package substrate 101 may adhere to the conductive bonding pad 117a over the entire width, W1, of the exposed surface of the bonding pad. The solder ball 114 may extend from the lower surface 119 of the package substrate 101 by a vertical height, H1. The vertical height, H1 of the solder ball 114 in the first region 301 of the package substrate 101 may be less than the outer diameter of the solder ball 114 prior to the first reflow process. For example, where the outer diameter of the solder ball 114 is between about 600 μm and about 650 μm (e.g., ~630 μm), the vertical height H1 of the solder ball 114 following the first reflow process may be between about 500 μm and about 550 μm (e.g., ~520 μm).

Referring again to FIG. 3, following the first solder reflow process, the solder ball 114 in the second region 302 may adhere to the conductive bonding pad 117b and may contact the bonding pad 117b over the entire width, W2, of the exposed surface of the bonding pad 117b. The solder ball 114 may also contact the sidewalls 121 of the raised structures 116. In various embodiments, the solder ball 114 may contact the sidewalls 121 of the raised structures 116 over the entire vertical height 201 of the sidewalls 121. The sidewalls 121 of the raised structures 116 may impart a pillar-like shape to the solder ball 114 that may increase a vertical height of the solder ball 114. In particular, the solder ball(s) 114 in second region 302 of the package substrate 101 may extend from the lower surface 119 of the package substrate 101 by a vertical height, H2, that is greater than the vertical height, H1, of the solder ball(s) in the first region 301. In some embodiments, vertical height H2 of the solder ball(s) 114 in the second region 302 may be at least about 20% greater, such as between 20-30% greater, than the vertical height H1 of the solder ball(s) in the first region 301 that does not include raised structures 116. For example, where the vertical height H1 of the solder ball(s) 114 in the first region 301 is between about 500 μm and about 550 μm (e.g., ~520 μm), the vertical height H2 of the solder ball(s) in the second region 302 may be between about 600 μm and about 715 μm (e.g., ~625 μm-675 μm). In some embodiments, the vertical height 201 of the sidewalls 121 laterally surrounding the solder ball(s) 114 in the second region 302 may be less than 75% of the vertical height H2 of the solder ball(s) 114 in the second region 302 following the first reflow process.

Referring again to FIG. 3, following the first solder reflow process, the solder ball 114 in the third region 303 may adhere to the conductive bonding pad 117c and may contact the bonding pad 117c over the entire width, W3, of the exposed surface of the bonding pad 117c. The solder ball 114 may also contact the sidewalls 121 of the raised structures 116. In various embodiments, the solder ball 114 may contact the sidewalls 121 of the raised structures 116 over the entire vertical height 201 of the sidewalls 121. The sidewalls 121 of the raised structures 116 may impart a pillar-like shape to the solder ball 114 that may increase a vertical height of the solder ball 114. In particular, the solder ball(s) 114 in third region 303 of the package substrate 101 may extend from the lower surface 119 of the package substrate 101 by a vertical height, H3, that is greater than the vertical height, H1, of the solder ball(s) in the first region 301, and is also greater than the vertical height, H2, of the solder ball(s) in the second region 302. In some embodiments, vertical height H3 of the solder ball(s) 114 in the third region 303 may be at least about 30% greater, such as between 30-50% greater, than the vertical height H1 of the solder ball(s) in the first region 301 that does not include raised structures 116. For example, where the vertical height H1 of the solder ball(s) 114 in the first region 301 is between about 500 μm and about 550 μm (e.g., ~520 μm), the vertical height H3 of the solder ball(s) in the third region 303 may be between about 650 μm and about 825 μm (e.g., —675 μm-780 μm). In some embodiments, the vertical height 201 of the sidewalls 121 laterally surrounding the solder ball(s) 114 in the third region 303 may be less than 75% of the vertical height H3 of the solder ball(s) 114 in the third region 303 following the first reflow process.

Figure 4:
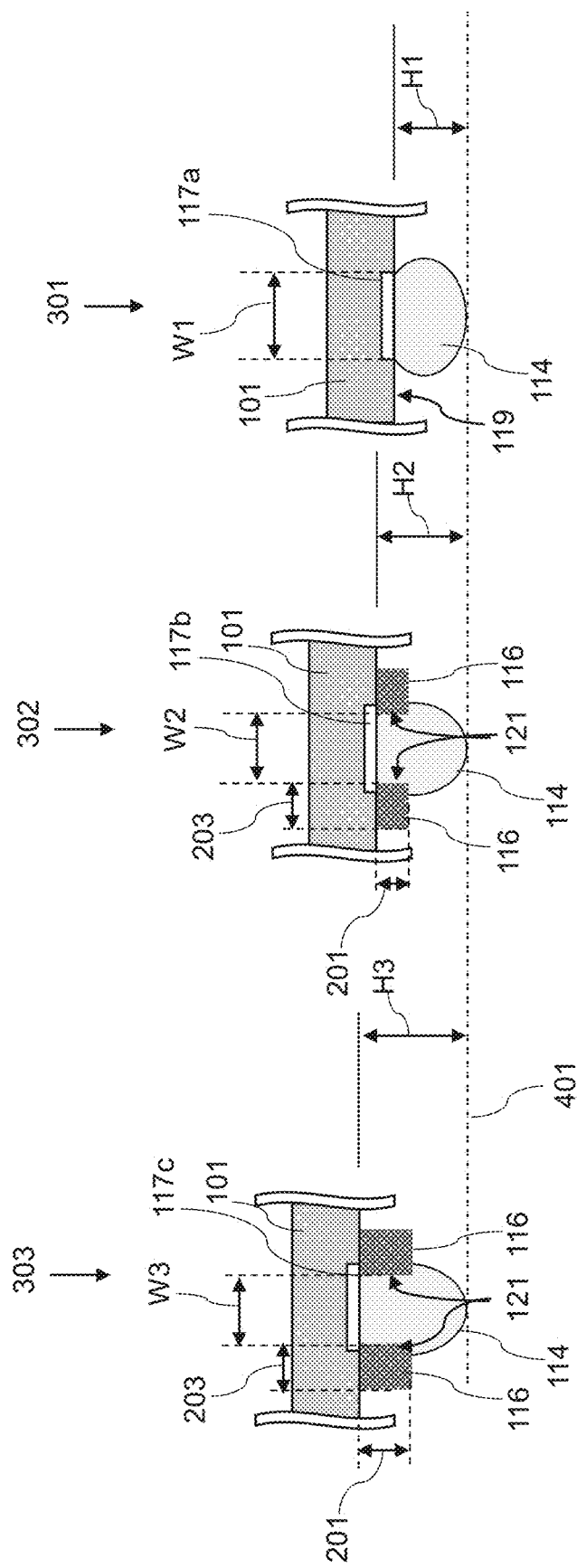
FIG. 4 is a vertical cross-section view illustrating solder balls in different regions of a package substrate that is subject to a warp deformation according to various embodiments of the present disclosure.

FIG. 4 is a vertical cross-section view illustrating solder balls 114 in different regions 301, 302 and 303 of a package substrate 101 that is subject to a warp deformation according to various embodiments of the present disclosure. FIG. 4 illustrates the package substrate 101 in an inverted configuration relative to FIG. 3 such that the lower surface 119 of the package substrate 101 including a plurality of solder balls 114 contacting respective conductive bonding pads 117a, 117b and 117c faces downwards towards a planar mounting surface 401. The planar mounting surface 401 may the upper surface 120 of a support substrate 102, such as the support substrate 102 shown in FIG. 2.

As schematically illustrated in FIG. 4, the warp deformation of the package substrate 101 results in variations of the distance between the lower surface 119 of the package substrate 101 and the planar mounting surface 401 in different regions 301, 302, 303 of the package substrate 101. In particular, the distance between the lower surface 119 of the package substrate 101 and the planar mounting surface 401 in the first region 301 of the package substrate 101 is less than the distance between the lower surface 119 of the package substrate 101 and the planar mounting surface 401 in the second region 302 of the package substrate 101, which is less than the distance between the lower surface 119 of the package substrate 101 and the planar mounting surface 401 in the third region 303 of the package substrate 401. However, as discussed above, the size, shape and/or locations of the raised structures 116 may be configured to compensate for such topological variations in the package substrate 101 by enhancing the co-planarity of the array of solder balls 114 that contact the planar mounting surface 401 during a solder-based mounting process. By engineering the size, shape and/or locations of the raised structures 116, the shapes of the solder balls 114 during the mounting process may be controlled such that the lower surfaces of the solder balls 114 may be substantially co-planar even in instances in which the package substrate 101 is subject to a deformation.

In various embodiments, the process of mounting the package substrate 101 onto the planar mounting surface 401, such as the upper surface 120 of a support substrate 102 as shown in FIG. 2, may include aligning the package substrate 101 over the planar mounting surface 401, such that the solder balls 114 contacting the conductive bonding pads 117a, 117b, 117c of the package substrate 101 are located over corresponding bonding pads (e.g., bonding pads 115 in FIG. 2) on the planar mounting surface 401, contacting the solder balls 114 to the corresponding bonding pads on the planar mounting surface 401, and performing a second solder reflow process that includes subjecting the package substrate 101 to an elevated temperature (e.g., at least about 250° C.) in order to melt the solder balls 114 and cause the solder balls 114 to adhere to the corresponding bonding pads on the planar mounting surface 401. Surface tension may cause the semi-liquid solder to maintain the package substrate 101 in alignment with the support substrate 102 while the solder material cools and solidifies. Upon solidification of the solder balls 114, the package substrate 101 may sit above the upper surface 120 of the support substrate 102 by a stand-off height that may be between about 0.4 mm to about 0.5 mm, although greater or lesser stand-of heights are within the contemplated scope of disclosure.

Following the mounting of the package substrate 101 to the surface substrate 102, a third underfill material portion 113 may be provided in the spaces surrounding the solder balls 114 and between the bottom surface 119 of the package substrate 101 and the upper surface 120 of the support substrate 102, as is shown in FIG. 2. In various embodiments, the third underfill material portion 113 may be composed of an epoxy-based material, which may include a composite of resin and filler materials.

In various embodiments, the raised structures 116 over the lower surface 119 of the package substrate 101 may be composed of a suitable dielectric material. In some embodiments, the raised structures 116 may be composed of an organic material, such as a polymer material, a thermoplastic material, a polyimide material, or the like. Other materials for the raised structures 116 are within the contemplated scope of disclosure. In one non-limiting embodiment, the raised structures 116 may be composed of a photoimageable polymer material, such as a photoimageable polyimide material. In some embodiments, the raised structures 116 may be formed of a solder resist (SR) material. In embodiments in which the lower surface 119 of the package substrate 101 is composed of a solder resist (SR) coating, the raised structures 116 may be formed of the same material as the material forming the lower surface 119 of the package substrate 101. In some embodiments, the raised structures 116 may be formed after the formation of the lower surface 119 of the package substrate 101 surrounding the conductive bonding pads 117a, 117b, 117c. In some embodiments, the raised structures 116 and the lower surface 119 of the package substrate 101 surrounding the conductive bonding pads 117a, 117b, 117c may be integrally formed. In some embodiments, the raised structures 116 may be formed of a different SR material than the SR material coating which forms the lower surface 119 of the package substrate 101 surrounding the conductive bonding pads 117a, 117b and 117c.

In some embodiments, the sidewalls 121 of the raised structures 116 may be composed of a material having a low wettability with of the solder material such that the partially melted solder material does not strongly adhere to the sidewalls 121 of the raised structures 116. In various embodiments, the raised structures 116 may be composed of a material having a Young's modulus that is between around 2 GPa to around 10 GPa, although materials having a smaller or larger Young's modulus may also be utilized. Materials having a Young's modulus in a range from ~2 GPa to ~10 GPa may aid in imparting a suitable shape of the solder ball 114 during a reflow process. In some embodiments, the raised structures 116 may be composed of a material having relatively high thermal stability. In various embodiments, the raised structures 116 may be composed of a material having a coefficient of thermal expansion (CTE) that is between about 12 ppm/° C. and about 130 ppm/° C., although materials having a smaller or larger CTE may also be utilized.

In embodiments in which the raised structures 116 are composed of a photoimageable polymer material, such as a photoimageable polyimide material, the raised structures 116 may be formed using a photolithographic process. In one non-limiting example, a continuous layer of a photoimageable material may be coated or deposited over the lower surface 119 of the package substrate 101 using a suitable coating or deposition process, such as screen printing, spray coating, spin coating, and the like. Other suitable deposition processes are within the contemplated scope of disclosure. Selected portions of the photoimageable material may be exposed to optical radiation (e.g., UV radiation) through a patterned mask. Exposure to optical radiation may chemically alter the photoimageable material by making the portions of the photoimageable material that are exposed through the mask either more or less soluble relative to the surrounding material that is not exposed to optical radiation. Thus, by selectively exposing portions of the photoimageable material to optical radiation through a patterned mask, the mask pattern may be transferred to the photoimageable material. A developing process may be used to remove the more soluble portions of the photoimageable material, leaving a desired pattern of raised structures 116 of the photoimageable material over the lower surface 119 of the package substrate 101. This process may optionally be repeated multiple times to provide raised structures 116 having different vertical heights in different regions of the package substrate 101.

Figure 5A:
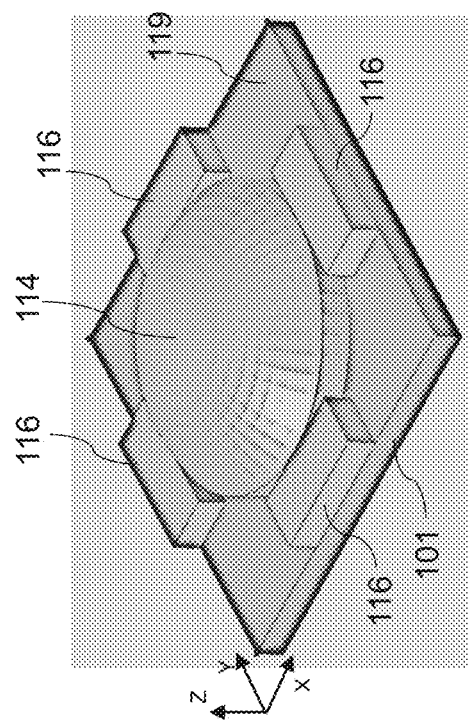
FIG. 5A is a perspective view of a portion of a package substrate showing a plurality of raised structures laterally surrounding a solder ball according to an embodiment of the present disclosure.
Figure 5B:
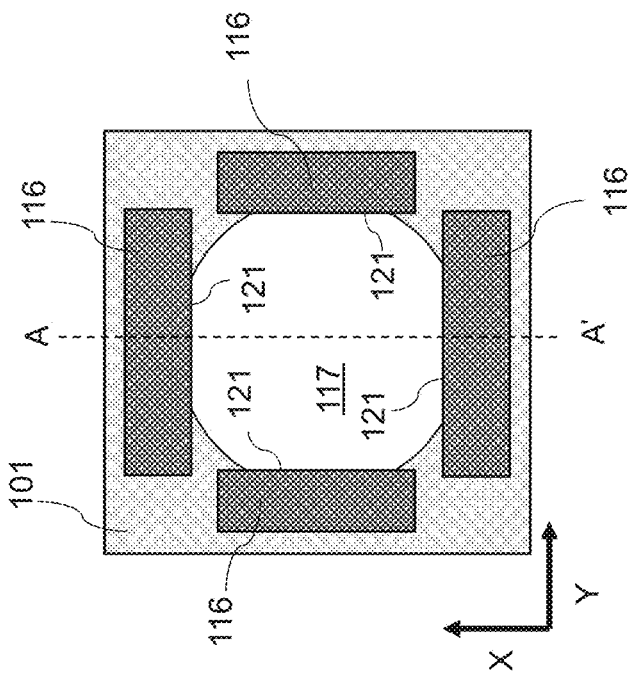
FIG. 5B is a bottom view of a portion of a package substrate illustrating a plurality of raised structures located over a portion of a conductive bonding pad according to an embodiment of the present disclosure.
Figure 5C:
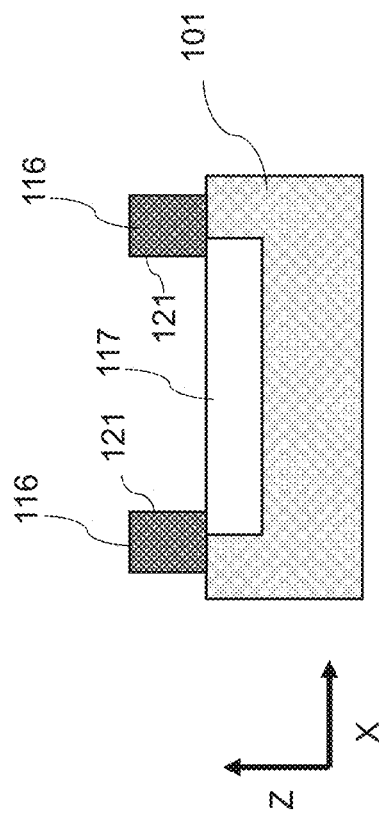
FIG. 5C is a vertical cross-section view of a portion of a package substrate along line A-A' in FIG. 5B.

FIG. 5A is a perspective view of a portion of a package substrate 101 showing a plurality of raised structures 116 laterally surrounding a solder ball 114 according to various embodiments of the present disclosure. FIG. 5B is a bottom view of the portion of the package substrate 101 with the solder ball 114 removed to illustrate the plurality of raised structures 116 located over a portion of a conductive bonding pad 117. FIG. 5C is a vertical cross-section view of the portion of the package substrate 101 along line A-A' in FIG. 5B.

Referring to FIGS. 5A-5C, four raised structures 116 are shown laterally surrounding a bonding pad 117 on the bottom surface 119 of the package substrate 101. Each of the raised structures 116 in this embodiment includes a rectangular prism-like shape. It will be understood that the raised structures 116 according to various embodiments may have any suitable shape, such as a polyhedron shape, a curved solid shape, an irregular shape, etc. As shown in FIGS. 5B and 5C, the raised structures 116 may be located partially over the surface of the bonding pad 117, such that a vertical sidewall 121 of each of the raised structures 116 may extend from the surface of the bonding pad 117 along the z-axis direction. As shown in FIG. 5A, a solder ball 114 located on the bonding pad 117 may contact each of the vertical sidewalls 121 of the raised structures 116. Although the vertical sidewalls 121 of the raised structures 116 shown in FIGS. 5A-5C have the same vertical height from the bottom surface 119 of the package substrate 101, it will be understood that the heights of the sidewalls 121 surrounding a bonding pad 117 may vary.

Figure 6:
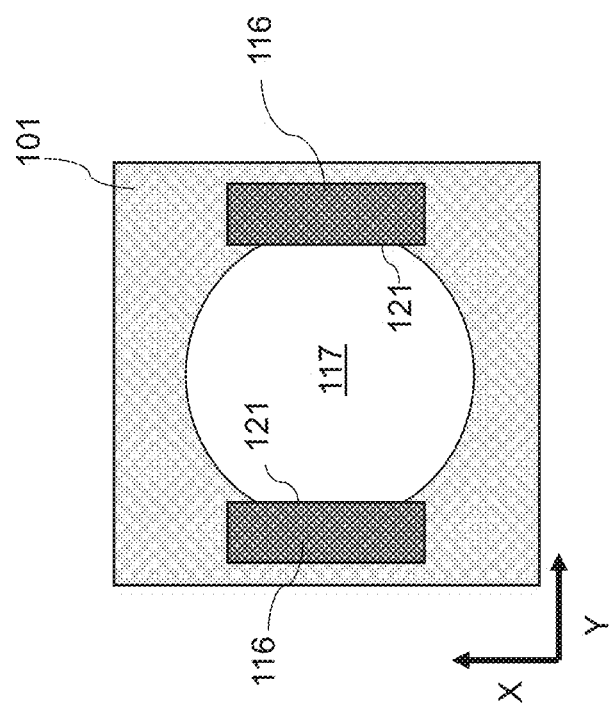
FIG. 6 is a bottom view of a portion of a package substrate illustrating a plurality of raised structures located over a portion of a conductive bonding pad according to another embodiment of the present disclosure.

FIG. 6 is a bottom view of a portion of a package substrate 101 including a plurality of raised structures 116 adjacent to a conductive bonding pad 117 according to another embodiment of the present disclosure. The embodiment shown in FIG. 6 includes two raised structures 116 located on opposite sides of the bonding pad 117. The raised structures 116 may be located partially over the surface of the bonding pad 117 such that sidewalls 121 of the respective raised structures 116 may extend from the surface of the bonding pad 117 along a vertical direction (i.e., the z-axis direction in FIG. 6). The sidewalls 121 of the raised structures 116 may extend parallel to each other along a horizontal direction (i.e., the x-axis direction in FIG. 6). A solder ball (not shown in FIG. 6) located on the bonding pad 117 may contact the sidewalls 121 of the raised structures 116 on opposite sides of the solder ball.

Figure 7:
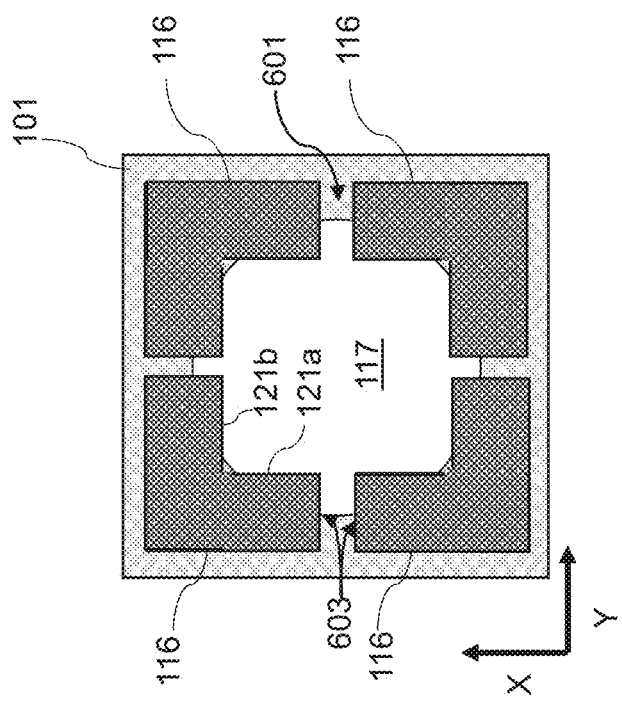
FIG. 7 is a bottom view of a portion of a package substrate illustrating a plurality of raised structures located over a portion of a conductive bonding pad according to yet another embodiment of the present disclosure.

FIG. 7 is a bottom view of a portion of a package substrate 101 including a plurality of raised structures 116 adjacent to a conductive bonding pad 117 according to yet another embodiment of the present disclosure. Referring to FIG. 7, four raised structures 116 are shown laterally surrounding the conductive bonding pad 117. Each of the raised structures 116 may have an elbow-shape. The raised structures 116 may be located partially over the surface of the bonding pad 117 such that sidewalls 121 of the respective raised structures 116 may extend from the surface of the bonding pad 117 along a vertical direction (i.e., the z-axis direction in FIG. 7). The sidewalls 121 of each of the raised structures 116 may include a first portion 121a that extends along a first horizontal direction (i.e., the x-axis direction in FIG. 7), and a second portion 121b that extends along a second horizontal direction (i.e., the y-axis direction in FIG. 7) that is perpendicular to the first horizontal direction. A solder ball (not shown in FIG. 7) located on the bonding pad 117 may contact the first portion 121a and the second portion 121b of each of the sidewalls 121 of the raised structures 116.

In the embodiment shown in FIG. 7, the elbow-shaped raised structures 116 do not continuously surround the conductive bonding pad 117 so that gaps 601 are present between the respective raised structures 116. In embodiments, a solder ball located on the bonding pad 117 may extend partially into the gaps 601, and may additionally contact the side surfaces 603 of raised structures 116.

In alternative embodiments, the raised structures 116 may have a "U"-shaped configuration, such that a pair of U-shaped raised structures 116 may continuously surround the bonding pad 117 on opposite sides of the bonding pad 117. In further embodiments, a raised structure 116 may have a square or rectangular shape such that the sidewall 121 of a single raised structure 116 may extend continuously around the bonding pad 117.

Figure 8:
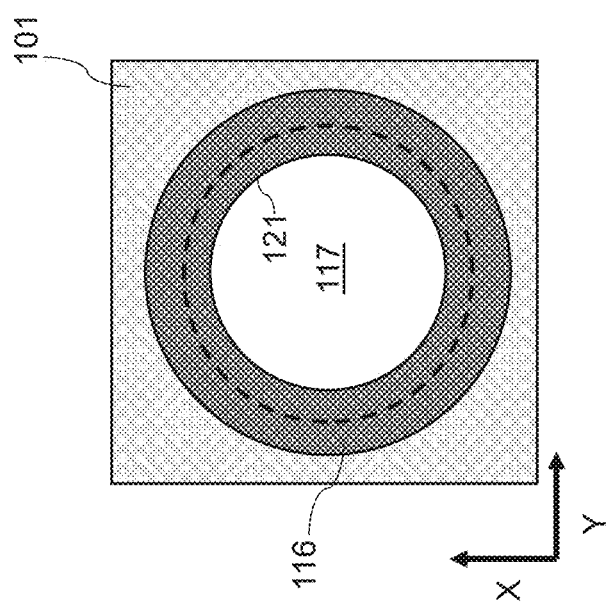
FIG. 8 is a bottom view of a portion of a package substrate illustrating a raised structure located over a portion of a conductive bonding pad and extending continuously around the periphery of the conductive bonding pad according to yet another embodiment of the present disclosure.

FIG. 8 is a bottom view of a portion of a package substrate 101 including a raised structure 116 extending continuously around a conductive bonding pad 117 according to yet another embodiment of the present disclosure. Referring to FIG. 8, the raised structure 116 may be located partially over the surface of the bonding pad 117. In FIG. 8, the outer periphery of the bonding pad 117 is indicated by a dashed line, and is located beneath the raised structure 116. The raised structure 116 may have a curved sidewall 121 that extends from the surface of the bonding pad 117 along a vertical direction (i.e., the z-axis direction in FIG. 8). The curved sidewall 121 may extend continuously over the bonding pad 117. The sidewall 121 may have a circular or oval shape in a horizontal cross-section (i.e., in the x-y plane). A solder ball (not shown in FIG. 8) located on the bonding pad 117 may contact the curved sidewall 121 of the raised structure 116 around an outer periphery of the solder ball.

Figure 9:
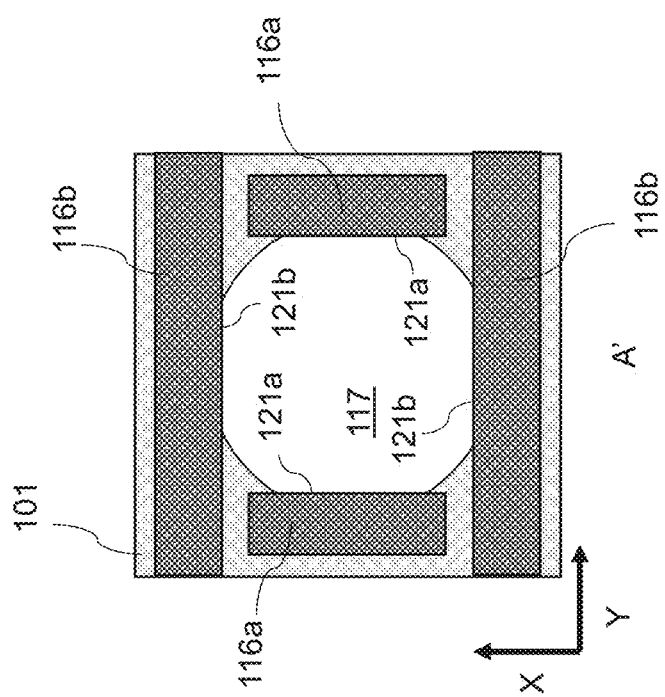
FIG. 9 is a bottom view of a portion of a package substrate including a plurality of raised structures adjacent to a conductive bonding pad according to yet another embodiment of the present disclosure.

FIG. 9 is a bottom view of a portion of a package substrate 101 including a plurality of raised structures 116a, 116b adjacent to a conductive bonding pad 117 according to yet another embodiment of the present disclosure. Referring to FIG. 9, four raised structures 116a, 116b are shown laterally surrounding the conductive bonding pad 117. A first pair of raised structures 116a may be located on opposite sides of the conductive bonding pad 117. The first pair of raised structures 116a may be similar to the raised structures 116 shown in FIGS. 5A-5C and may be located partially over the surface of the bonding pad 117, such that a vertical sidewall 121a of each of the raised structures 116a may extend vertically from the surface of the bonding pad 117. The vertical sidewalls 121a may extend parallel to one another along a first horizontal direction (i.e., the x-axis direction in FIG. 9). A second pair of raised structures 116b may be located on opposite sides of the conductive bonding pad 117. The second pair of raised structures 116b may extend continuously along a second horizontal direction (i.e., the y-axis direction in FIG. 9) that is perpendicular to the first horizontal direction. In embodiments, the second pair of raised structures 116b may extend continuously adjacent to multiple conductive bonding pads 117, including all of the conductive bonding pads 117, along a particular column or row of an array of bonding pads 117 on the bottom surface 119 of the package substrate 101. The second pair of raised structures 116b may be located partially over the surfaces of the adjacent bonding pads 117, such that a vertical sidewall 121b of each of the raised structures 116b may extend vertically from the surfaces of the bonding pads 117. The vertical sidewalls 121a may extend parallel to one another along the second horizontal direction (i.e., the x-axis direction in FIG. 9). The vertical heights of sidewalls 121a and 121b may be the same, or may be different. In one non-limiting example, sidewalls 121b may have constant vertical height as the sidewalls 121b extend adjacent to multiple conductive bonding pads 117 on the bottom surface 119 of the package substrate 101, while the vertical heights of sidewalls 121a may vary in different regions of the package substrate 101. A solder ball (not shown in FIG. 9) located on the bonding pad 117 may contact the sidewalls 121a and 121b of the raised structures 116.

In another embodiment, raised structures 116a may also extend continuously along the first horizontal direction (i.e., the y-axis direction in FIG. 9) adjacent to multiple conductive bonding pads 117 in a particular row or column of bonding pads 117 such that the raised structures 116a and 116b may form a grid pattern surrounding the conductive bonding pads 117 over all or a particular region of the bottom surface 119 of the package substrate 101.

FIG. 10A is a bottom view of a portion of a package substrate 101 including a plurality of raised structures 116 adjacent to a conductive bonding pad 117 according to another embodiment of the present disclosure. FIG. 10B is a vertical cross-section view of the portion of the package substrate 101 along line B-B' in FIG. 10A. The raised structures 116 may have an elbow shape similar to the embodiment of FIG. 7, where sidewalls 121 of each of the elbow-shaped raised structures 116 may include a first portion 121a that extends along a first horizontal direction (i.e., the x-axis direction in FIG. 10A), and a second portion 121b that extends along a second horizontal direction (i.e., the y-axis direction in FIG. 10A) that is perpendicular to the first horizontal direction. In the embodiment shown in FIGS. 10A and 10B, each of the raised structures 116 may include a first segment 116a defining the first portion 121a of the sidewall 121 and a second segment 116b defining the second portion 121b of the sidewall 121. The first segments 116a of the raised structures 116 may have a different vertical height than the second segments 116b of the raised, such that the first portions 121a of the sidewalls 121 extending along the first horizontal direction have a different vertical height than the second portions 121b of the sidewalls 121 extending along the second horizontal direction. In the embodiment shown in FIGS. 10A and 10B, the second portions 121b of the sidewalls 121 have a greater vertical height than the first portions 121a of the sidewalls 121. A solder ball (not shown in FIGS. 10A and 10B) located on the bonding pad 117 may contact the first sidewall portions 121a and the second sidewall portions 121b of the raised structures 116.

Figure 11:
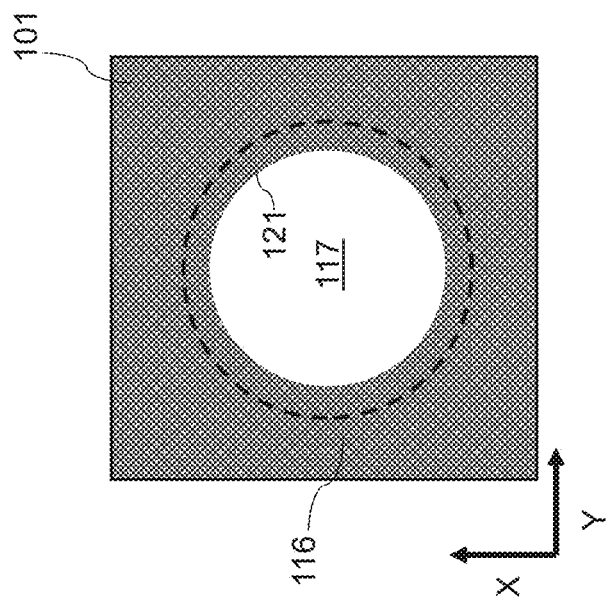
FIG. 11 is a bottom view of a portion of a package substrate including a raised structure extending continuously around a conductive bonding pad according to yet another embodiment of the present disclosure.

FIG. 11 is a bottom view of a portion of a package substrate 101 including a raised structure 116 extending continuously around a conductive bonding pad 117 according to yet another embodiment of the present disclosure. The embodiment shown in FIG. 11 is similar to the embodiment of FIG. 8 in that the raised structure 116 may partially cover the surface of the bonding pad 117 and include a curved sidewall 121 that extends continuously over the surface of the bonding pad 117. In the embodiment shown in FIG. 11, the raised structure 116 may extend continuously over all or a portion of the bottom surface 119 of the package substrate 101, such that the raised structure 116 may extend to and partially cover multiple conductive bonding pads 117, including all of the conductive bonding pads 117, on the bottom surface 119 of the package substrate 101. Openings through the raised structure 116 may expose the surfaces of the multiple conductive bonding pads 117 and define vertical sidewalls 121 extending from the surfaces of the conductive bonding pads 117. In some embodiments, a vertical height of the raised structure 116, and thus the vertical height of the respective sidewalls 121, may vary across different regions of the bottom surface 119 of the package substrate. Solder balls (not shown in FIG. 11) located on the respective bonding pads 117 may contact the curved sidewalls 121 of the raised structure 116 around an outer periphery of the solder balls.

Figure 12:
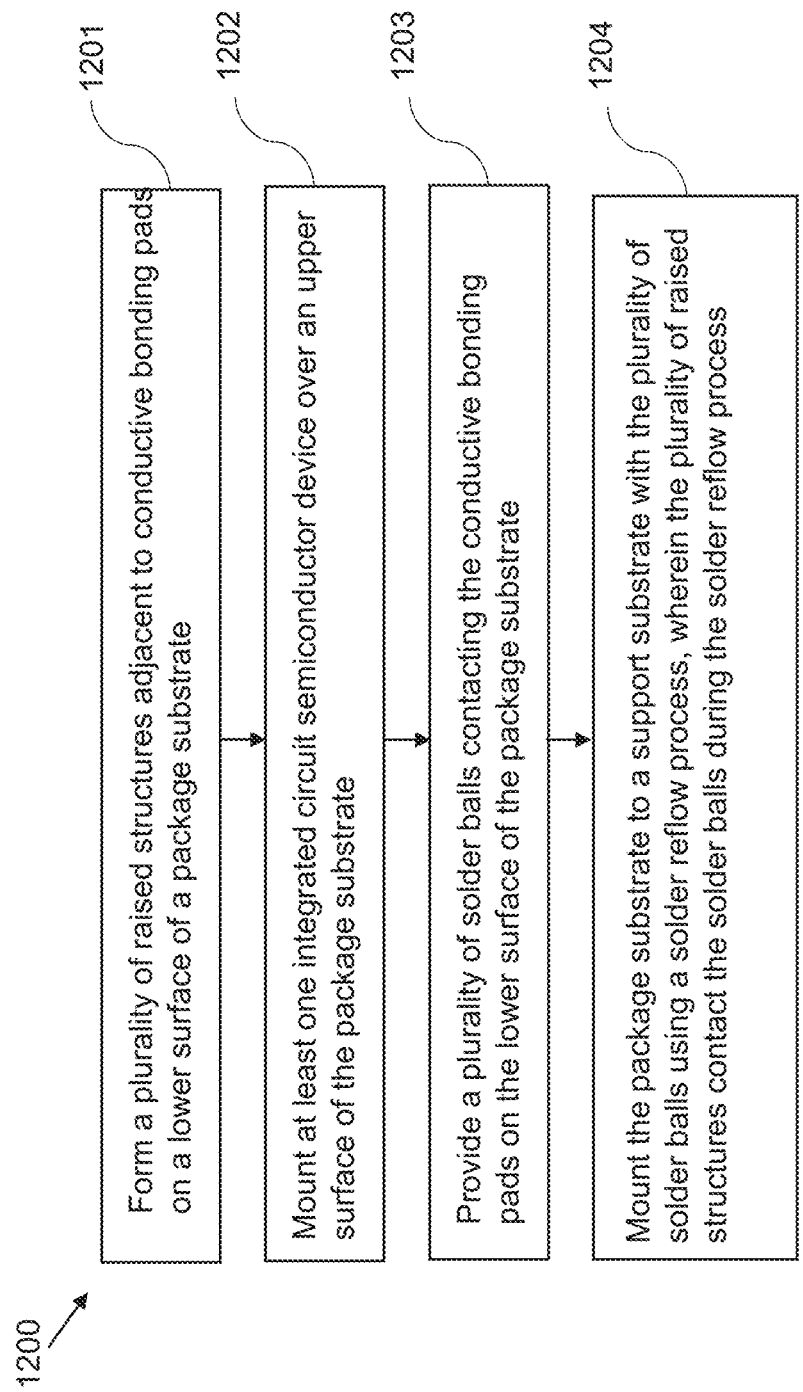
FIG. 12 is a flow diagram illustrating a method for mounting a semiconductor package onto a support substrate according to various embodiments of the present disclosure.

FIG. 12 is a flowchart illustrating a method 1200 of mounting a semiconductor package 200 onto a support substrate 102 according to various embodiments of the present disclosure. Referring to FIGS. 2-12, the method 1200 may include a step 1201, which includes forming a plurality of raised structures 116 adjacent to conductive bonding pads 117 on a lower surface 119 of a package substrate 101. Referring to FIGS. 2 and 12, the method 1200 may further include a step 1202, which includes mounting at least one semiconductor device 105, 107 over an upper surface 123 of the package substrate 101. Referring to FIGS. 2-12, the method 1200 may further include a step 1203, which includes providing a plurality of solder balls 114 contacting the conductive bonding pads 117 on the lower surface 119 of the package substrate 101. Referring to FIGS. 2-12, the method 1200 may further include a step 1204, which includes mounting the package substrate 101 to a support substrate 102 with the plurality of solder balls 114 using a solder reflow process, wherein the plurality of raised structures 116 contact the solder balls 114 during the solder reflow process.

Referring to all drawings and according to various embodiments of the present disclosure, a semiconductor package 200 includes a package substrate 101 having an upper surface 123 and a lower surface 119, the lower surface 119 of the package substrate 101 including a first plurality of conductive bonding pads 117, and a plurality of raised structures 116 adjacent to at least some of the conductive bonding pads 117 of the first plurality of conductive bonding pads 117, and at least one semiconductor device 105, 107 mounted over the upper surface 123 of the package substrate 101, where the package substrate 101 is mounted to a support substrate 102 by a plurality of solder connections 114, each solder connection 114 extending between a respective conductive bonding pad 117 of the first plurality of conductive bonding pads 117 and a conductive bonding pad 115 of a second plurality of conductive bonding pads 115 on the support substrate 102, and the raised structures 116 adjacent to at least some of the conductive bonding pads 117 of the first plurality of bonding pads comprise sidewalls 121 that contact the solder connection 114, and a height dimension of the sidewalls 121 varies in different regions of the package substrate 101.

In an embodiment, the package substrate 101 includes an organic material, the support substrate 102 includes a printed circuit board (PCB), and the plurality of solder connections 114 are formed using a ball grid array (BGA).

In another embodiment, each of the raised structures 116 has a width dimension that is greater than 100 μm.

In another embodiment, at least some of the raised structures 116 are located partially over a conductive bonding pad 117 of the first plurality of conductive bonding pads 117 such that a sidewall 121 of the raised structure 116 extends in a vertical direction from a surface of the conductive bonding pad 117.

In another embodiment, the raised structures 116 include sidewalls 121 on opposite sides of at least some of the conductive bonding pads 117 of the first plurality of conductive bonding pads 117, wherein a distance between the sidewalls 121 on opposite sides of a conductive bonding pad 117 defines a width (W2, W3) of an exposed surface of the conductive bonding pad 117.

In another embodiment, the distance between the sidewalls 121 on opposite sides of the conductive bonding pads 117 is greater than 70% of a width (W1) of the exposed surface of the conductive bonding pad 117 with no raised structures 116 located adjacent to the conductive bonding pad 117.

In another embodiment, the package substrate 101 includes a first region 301 that does not include raised structures 116 adjacent to the conductive bonding pads 117 located in the first region 301, and a second region 302 that includes raised structures 116 adjacent to the conductive bonding pads 117 located in the second region 302.

In another embodiment, the sidewalls 121 of the raised structures 116 in the second region 302 of the package substrate 101 have a first height dimension 201, the package substrate further including a third region 303 that includes raised structures 116 adjacent to the conductive bonding pads 117 in the third region 302, and the sidewalls 121 of the raised structures 116 in the third region 303 of the package substrate 101 have a second height dimension 201 that is greater than the first height dimension 201.

In another embodiment, the raised structures include a solder resist material.

An additional embodiment is drawn to a substrate 101 for a semiconductor package 200 that includes a plurality of conductive bonding pads 117 on a first surface 119 of the substrate 101, and a plurality of raised structures 116 adjacent to one or more first conductive bonding pads 117 on the first surface 119 of the substrate 101, where one or more second conductive bonding pads 117 on the first surface 119 of the substrate 101 is free of raised structures 116 adjacent to the second conductive bonding pads 117.

In an embodiment, the locations of the plurality of raised structures 116, and the sizes and shapes of the raised structures 116, are configured to compensate for a deformity of the substrate 101 during a process of mounting the substrate 101 to a support substrate 102 using a plurality of solder balls 114 attached to the conductive bonding pads 114 on the first surface 119 of the substrate 101.

In another embodiment, each of the raised structures 116 is configured to control a shape of a solder ball 114 contacting the raised structure 116 during a solder reflow process to increase a degree of co-planarity between the plurality of solder balls 114 when the substrate 101 is mounted to the support substrate 102.

In another embodiment, at least some of the raised structures 116 increase a vertical height of a solder ball 114 contacting the raised structure 116 by between 20% and 50% relative to a solder ball 114 that contacts a conductive bonding pad 117 that does not include a raised structure 116 adjacent to the conductive bonding pad 117.

In another embodiment, at least one of the conductive bonding pads 117 on the first surface 119 of the substrate 101 includes a raised structure 116 located partially over a surface of the conductive bonding pad 117.

In another embodiment, at least one of the conductive bonding pads 117 on the first surface 119 of the substrate 101 includes a pair of raised structures 116 located partially over a surface of the conductive bonding pad 117, where each of the raised structures 116 of the pair of raised structures 116 includes a sidewall 121 that extends from the surface of the bonding pad 117 along a vertical direction, and the sidewalls 121 of the pair of raised structures 116 extend parallel to each other along a first horizontal direction.

In another embodiment, at least one of the conductive bonding pads 117 further includes a second pair of raised structures 116 located partially over the surface of the conductive bonding pad 117, wherein each of the raised structures 116 of the second pair of raised structures 116 includes a sidewall 121 that extends from the surface of the bonding pad 117 along a vertical direction, and the sidewalls 121 of the raised structures 116 of the second pair of raised structures 116 extend parallel to each other along a second horizontal direction that is perpendicular to the first horizontal direction.

In another embodiment, the raised structure 116 located partially over the conductive bonding pad 117 includes a sidewall 121 that extends in a vertical direction from the surface of the conductive bonding pad 117, and where at least one of (a) the sidewall 121 of the raised structure includes a first portion 121a that extends along a first horizontal direction and a second portion 121b that extends along a second horizontal direction that is perpendicular to the first horizontal direction, or (b) the sidewall 121 extends continuously around the periphery of the conductive bonding pad 117, or (c) the sidewall 121 extends continuously between the surface of the conductive bonding pad 117 to the surface of an adjacent conductive bonding pad 117 on the first surface 119 of the substrate 101.

Another embodiment is drawn to a method of mounting a semiconductor package 200 onto a support substrate 102, including forming a plurality of raised structures 116 adjacent to conductive bonding pads 117 on a lower surface 119 of a package substrate 101 where a height dimension of the plurality of raised structures varies in different regions of the package substrate, mounting at least one semiconductor device 105, 107 over an upper surface 123 of the package substrate 101, providing a plurality of solder balls 114 contacting the conductive bonding pads 117 on the lower surface 119 of the package substrate 101, and mounting the package substrate 101 to a support substrate 102 with the plurality of solder balls 114 using a solder reflow process.

In an embodiment, providing the plurality of solder balls 114 contacting the conductive bonding pads 117 on the lower surface 119 of the package substrate 101 includes placing a plurality of solder balls 114 over a plurality of conductive bonding pads 117 on the lower surface 119 of the package substrate 101, and performing a first solder reflow process to adhere the plurality of solder balls 114 to respective conductive bonding pads 117 of the plurality of conductive bonding pads 117, where the raised structures 116 adjacent to conductive bonding pads 117 contact the solder balls 114 during the first solder reflow process to control a vertical height of the solder balls 114 relative to the lower surface 119 of the package substrate 101.

In another embodiment, forming a plurality of raised structures 116 includes depositing a continuous layer of a photoimageable polymer material over the lower surface 119 of the package substrate 101, exposing selected portions of the layer of photoimageable polymer material to optical radiation through a patterned mask to make the selected portions of the layer of photoimageable polymer material more or less soluble than the portions of the layer of photoimageable polymer material that is not exposed to the optical radiation, and removing more soluble portions of the layer of photoimageable polymer material from the lower surface 119 of the package substrate 101 to provide the raised structures 116 adjacent to at least some of the conductive bonding pads 117 on the lower surface 119 of the package substrate 101.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a package substrate having an upper surface and a lower surface, the lower surface of the package substrate comprising:
      a first plurality of conductive bonding pads; and
      a plurality of raised structures adjacent to at least some of the conductive bonding pads of the first plurality of conductive bonding pads; and
   at least one semiconductor device mounted over the upper surface of the package substrate, wherein:
   the package substrate is mounted to a support substrate by a plurality of solder connections, each solder connection extending between a respective conductive bonding pad of the first plurality of conductive bonding pads and a conductive bonding pad of a second plurality of conductive bonding pads on the support substrate, and
   the plurality of raised structures adjacent to at least some of the conductive bonding pads of the first plurality of bonding pads comprise sidewalls that contact the solder connection, and a height dimension of the sidewalls varies in different regions of the package substrate.

2. The semiconductor package of claim 1, wherein the package substrate comprises an organic material, the support substrate comprises a printed circuit board (PCB), and the plurality of solder connections are formed using a ball grid array (BGA).

3. The semiconductor package of claim 1, wherein each of the plurality of raised structures has a width dimension that is greater than 100 μm.

4. The semiconductor package of claim 1, wherein at least some of the plurality of raised structures are located partially over a conductive bonding pad of the first plurality of conductive bonding pads such that a sidewall of one of the plurality of raised structures extends in a vertical direction from a surface of the conductive bonding pad.

5. The semiconductor package of claim 4, wherein the plurality of raised structures include sidewalls on opposite sides of at least some of the conductive bonding pads of the first plurality of conductive bonding pads, wherein a distance between the sidewalls on opposite sides of a conductive bonding pad defines a width of an exposed surface of the conductive bonding pad.

6. The semiconductor package of claim 5, wherein the distance between the sidewalls on opposite sides of the conductive bonding pads is greater than 70% of a width of the exposed surface of the conductive bonding pad with no raised structures located adjacent to the conductive bonding pad.

7. The semiconductor package of claim 1, wherein the package substrate comprises a first region that does not include raised structures adjacent to the conductive bonding pads located in the first region, and a second region that includes raised structures adjacent to the conductive bonding pads located in the second region.

8. The semiconductor package of claim 7, wherein the sidewalls of the raised structures in the second region of the package substrate have a first height dimension, the package substrate further comprising a third region that includes raised structures adjacent to the conductive bonding pads in the third region, and the sidewalls of the raised structures in the third region of the package substrate have a second height dimension that is greater than the first height dimension.

9. The semiconductor package of claim 1, wherein the raised structures comprise a solder resist material.

10. A substrate for a semiconductor package, comprising:
    a plurality of conductive bonding pads on a first surface of the substrate; and
    a plurality of raised structures adjacent to one or more first conductive bonding pads of the plurality of conductive bonding pads on the first surface of the substrate, wherein one or more second conductive bonding pads on the first surface of the substrate is free of raised structures adjacent to the second conductive bonding pads, wherein at least one of the first conductive bonding pads on the first surface of the substrate includes a pair of raised structures located partially over a surface of the first conductive bonding pad, wherein each raised structure of the pair of raised structures comprises a sidewall that extends from the surface of the first conductive bonding pad along a vertical direction, and the sidewalls of the pair of raised structures extend parallel to each other along a first horizontal direction.

11. The substrate of claim 10, wherein the locations of the plurality of raised structures, and the sizes and shapes of the raised structures, are configured to compensate for a deformity of the substrate during a process of mounting the substrate to a support substrate using a plurality of solder balls attached to the conductive bonding pads on the first surface of the substrate.

12. The substrate of claim 11, wherein each of the plurality of raised structures is configured to control a shape of a solder ball contacting the raised structure during a solder reflow process to increase a degree of co-planarity between the plurality of solder balls when the substrate is mounted to the support substrate.

13. The substrate of claim 12, wherein at least some of the plurality of raised structures increase a vertical height of a solder ball contacting the raised structure by between 20% and 50% relative to a solder ball that contacts a conductive bonding pad that does not include a raised structure adjacent to the conductive bonding pad.

14. The substrate of claim 10, wherein at least one of the first conductive bonding pads further includes a second pair of raised structures located partially over the surface of the first conductive bonding pad, wherein each of the raised structures of the second pair of raised structures comprises a sidewall that extends from the surface of the first conductive bonding pad along a vertical direction, and the sidewalls of the raised structures of the second pair of raised structures extend parallel to each other along a second horizontal direction that is perpendicular to the first horizontal direction.

15. The substrate of claim 10, wherein the plurality of raised structures comprise a solder resist material.

16. A substrate for a semiconductor package, comprising:
a plurality of conductive bonding pads on a first surface of the substrate; and
a plurality of raised structures adjacent to one or more first conductive bonding pads of the plurality of conductive bonding pads on the first surface of the substrate, wherein one or more second conductive bonding pads on the first surface of the substrate is free of raised structures adjacent to the second conductive bonding pads, wherein at least one of the first conductive bonding pads on the first surface of the substrate includes a raised structure located partially over a surface of the first conductive bonding pad, the raised structure comprising a sidewall that extends from the surface of the first conductive bonding pad along a vertical direction and the sidewall faces a central region of the first conductive bonding pad.

17. The substrate of claim 16, wherein the sidewall of the raised structure includes a first portion that extends along a first horizontal direction and a second portion that extends along a second horizontal direction that is perpendicular to the first horizontal direction.

18. The substrate of claim 16, wherein the sidewall extends continuously around the periphery of the first conductive bonding pad.

19. The substrate of claim 16, wherein the sidewall extends continuously between the surface of the first conductive bonding pad to the surface of an adjacent first conductive bonding pad on the first surface of the substrate.

20. The substrate of claim 16, wherein the plurality of raised structures comprise a solder resist material.

* * * * *